(12) United States Patent
Okita et al.

(10) Patent No.: US 7,187,052 B2
(45) Date of Patent: Mar. 6, 2007

(54) PHOTOELECTRIC CONVERSION APPARATUS AND IMAGE PICK-UP SYSTEM USING THE PHOTOELECTRIC CONVERSION APPARATUS

(75) Inventors: Akira Okita, Kanagawa (JP); Katsuhito Sakurai, Tokyo (JP); Hiroki Hiyama, Kanagawa (JP); Hideaki Takada, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/971,151

(22) Filed: Oct. 25, 2004

(65) Prior Publication Data

US 2005/0098805 A1 May 12, 2005

(30) Foreign Application Priority Data

Nov. 10, 2003 (JP) ............................. 2003-380090

(51) Int. Cl.
*H01L 29/72* (2006.01)
(52) U.S. Cl. ................ 257/444; 257/431; 257/446; 257/448; 257/450; 257/452; 257/459; 257/461; 257/463
(58) Field of Classification Search ................ 257/422, 257/431, 444, 446, 448, 450, 452, 459, 461, 257/463
See application file for complete search history.

(56) References Cited

U.S. PATENT DOCUMENTS

| 6,188,094 | B1 | 2/2001 | Kochi et al. ................ 257/232 |
| 6,423,993 | B1 | 7/2002 | Suzuki et al. ................ 257/292 |
| 6,492,668 | B2 | 12/2002 | Maeda ........................ 257/226 |
| 6,605,850 | B1 | 8/2003 | Kochi et al. ................ 257/431 |
| 6,670,990 | B1 | 12/2003 | Kochi et al. ................ 348/310 |
| 6,674,470 | B1 | 1/2004 | Tanaka et al. ............... 348/302 |
| 6,774,453 | B2 | 8/2004 | Okita ......................... 257/506 |
| 2002/0079518 | A1 | 6/2002 | Maeda ........................ 257/226 |
| 2003/0160295 | A1 | 8/2003 | Okita ......................... 257/506 |
| 2003/0164887 | A1 | 9/2003 | Koizumi et al. ............. 348/308 |
| 2003/0218117 | A1 | 11/2003 | Hiyama et al. ............. 250/208 |
| 2005/0176167 | A1* | 8/2005 | Lee ............................. 438/60 |

FOREIGN PATENT DOCUMENTS

| JP | 10-150182 | 2/1998 |
| JP | 10-150182 A | 6/1998 |
| JP | 2002-190586 A | 7/2002 |
| JP | 2002-353430 A | 12/2002 |
| JP | 2003-87663 A | 3/2003 |
| JP | 2003-258229 A | 9/2003 |

\* cited by examiner

*Primary Examiner*—Edward Wojciechowicz
(74) *Attorney, Agent, or Firm*—Fitzpatrick, Cella, Harper & Scinto (57) ABSTRACT

A primary object of the present invention is to provide a photoelectric conversion apparatus with less leak current in a floating diffusion region. In order to obtain the above object, a photoelectric conversion apparatus according to the present invention includes a photodiode for converting light into a signal charge, a first semiconductor region having a first conductivity type, a floating diffusion region formed from a second semiconductor region having a second conductivity type for converting the signal charge generated by the photodiode into a signal voltage, the second semiconductor region being formed in the first semiconductor region, and an electrode formed above the first semiconductor region through an insulating film and having an effect of increasing a concentration of majority carriers in the first semiconductor region, in which the electrode is not formed above a depletion region formed from the second semiconductor region.

6 Claims, 8 Drawing Sheets

PHOTOELECTRIC CONVERSION APPARATUS AND IMAGE PICK-UP SYSTEM USING THE PHOTOELECTRIC CONVERSION APPARATUS

BACKGROUND OF THE INVENTION

1. Field of the Invention

The present invention relates to a photoelectric conversion apparatus and an amplification solid state image pick-up apparatus and system using the same. In particular, the invention relates to a photoelectric conversion apparatus, and an image pick-up apparatus and system such as a digital camera, a video camera, a copying machine, or a facsimile machine.

2. Related Background Art

An image sensor has been installed in many kinds of apparatuses such as a digital camera, a video camera, a copying machine, and a facsimile machine, where solid state image pick-up devices including photoelectric conversion devices are arranged in a one- or two-dimensional array. Examples of such solid state image pick-up devices include a CCD image pick-up device and an amplification solid state image pick-up device.

There is a growing tendency to increase the number of pixels in those image pick-up devices. As the area per pixel is reduced, the area allotted to the photodiode accordingly tends to be smaller. Thus, there arise a need to process a smaller quantity of signal charge and a need to lessen a leak current that may result in a noise component.

Figure 4:
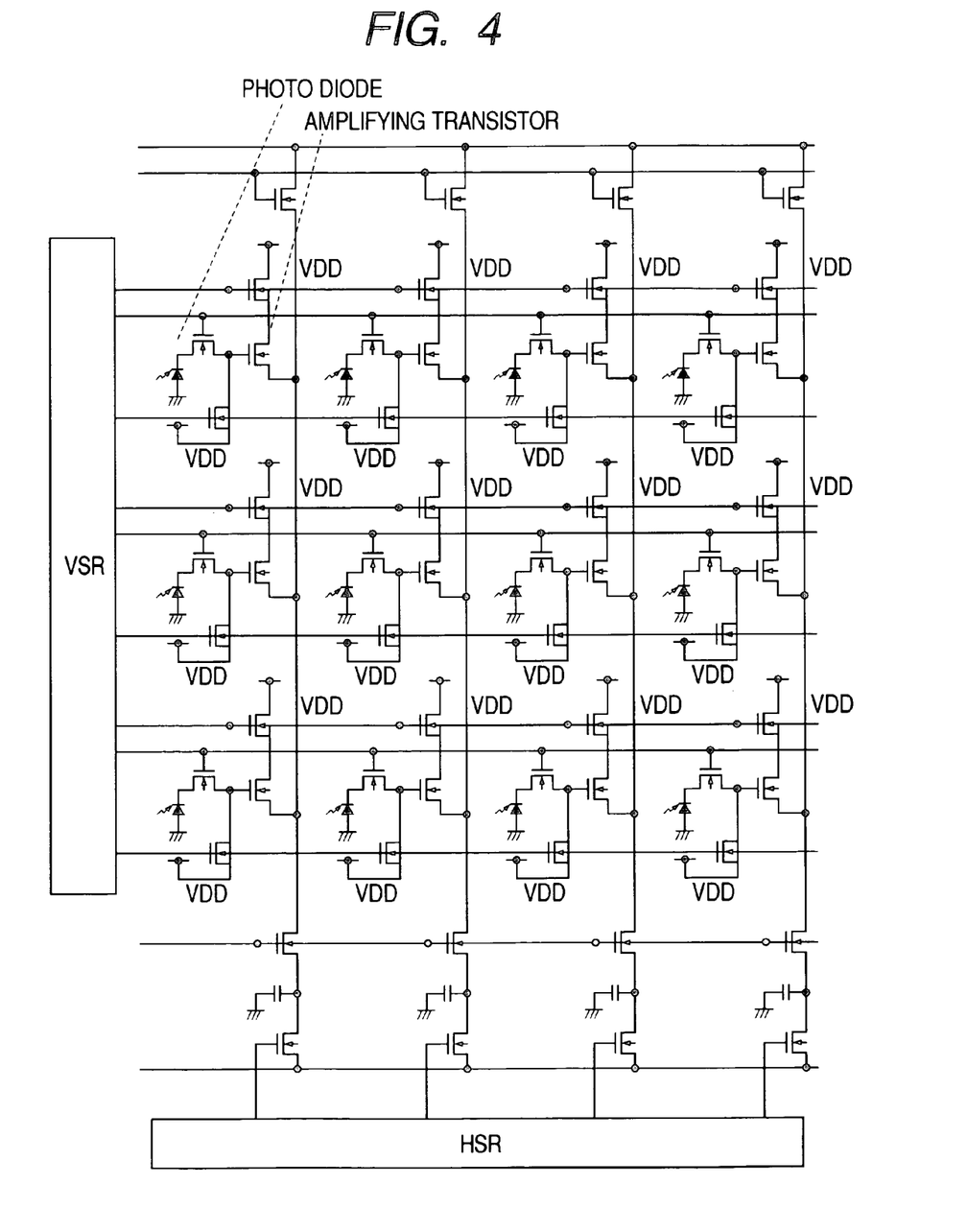
FIG. 4 is a plan view showing a circuit configuration example of an amplification solid state image pick-up device.

FIG. 4 shows a circuit configuration example of an amplification solid state image pick-up device. The amplification solid state image pick-up device includes at least in a unit pixel: a photodiode; and an amplifying transistor that amplifies light signals accumulated in the photodiode. The unit pixels are arranged in a two-dimensional array.

Figure 5:
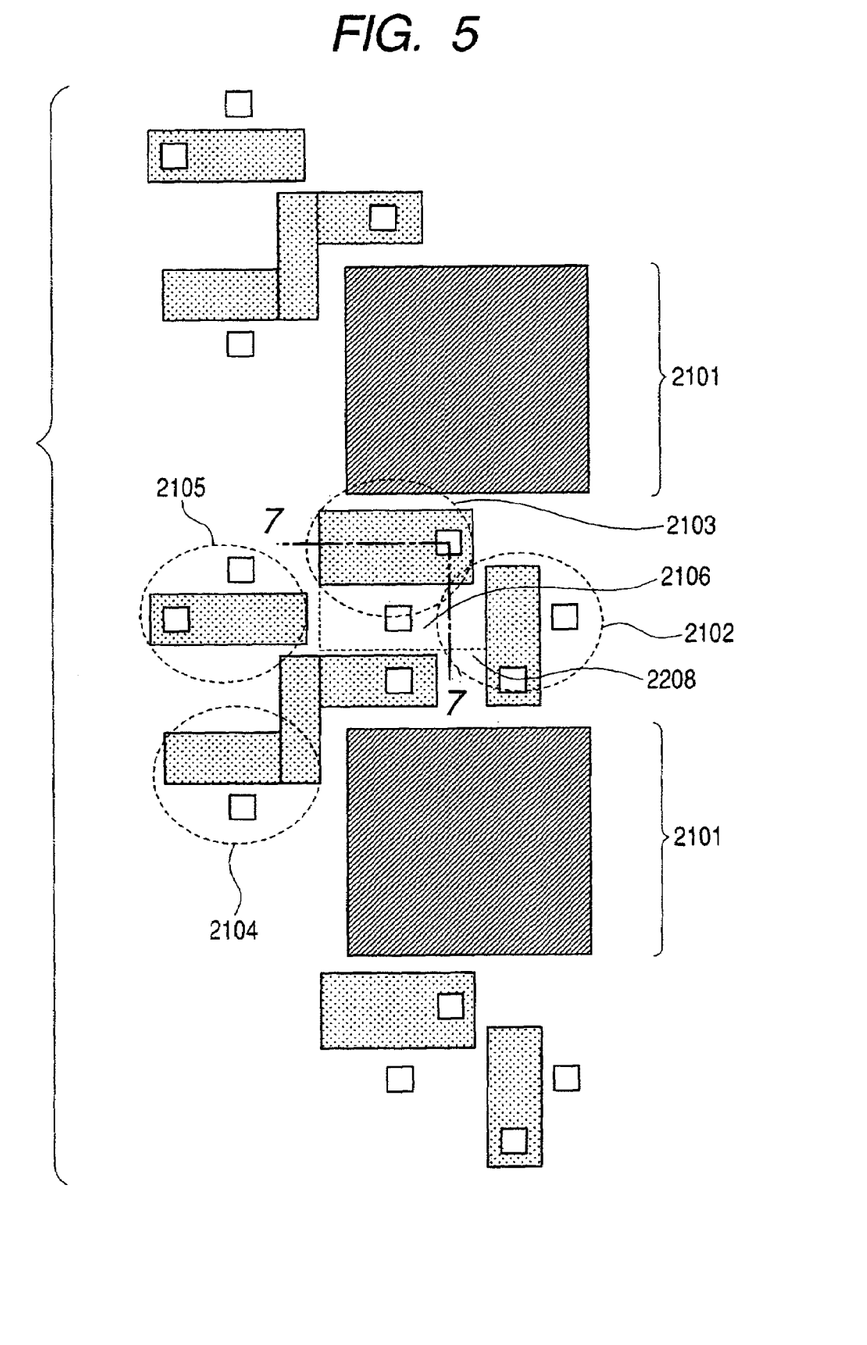
FIG. 5 is a plan view showing a conventional photoelectric conversion apparatus.

FIG. 5 is a plan view showing a pixel structure in a unit cell in a conventional amplification MOS sensor. In FIG. 5, reference numeral 2101 denotes a photodiode for photoelectric conversion; 2102, a reset transistor for resetting the photodiode 2101 and a floating diffusion (FD) region 2106; 2103, a transfer MOS transistor for transferring (reading out) signal charges in the photodiode 2101; 2104, a source follower amplifier for converting the transferred (read-out) charges into a voltage, with its gate electrode connected to the FD region 2106; and 2105, a row selection MOS transistor that connects an output of the source follower amplifier to a signal line.

Figure 6:
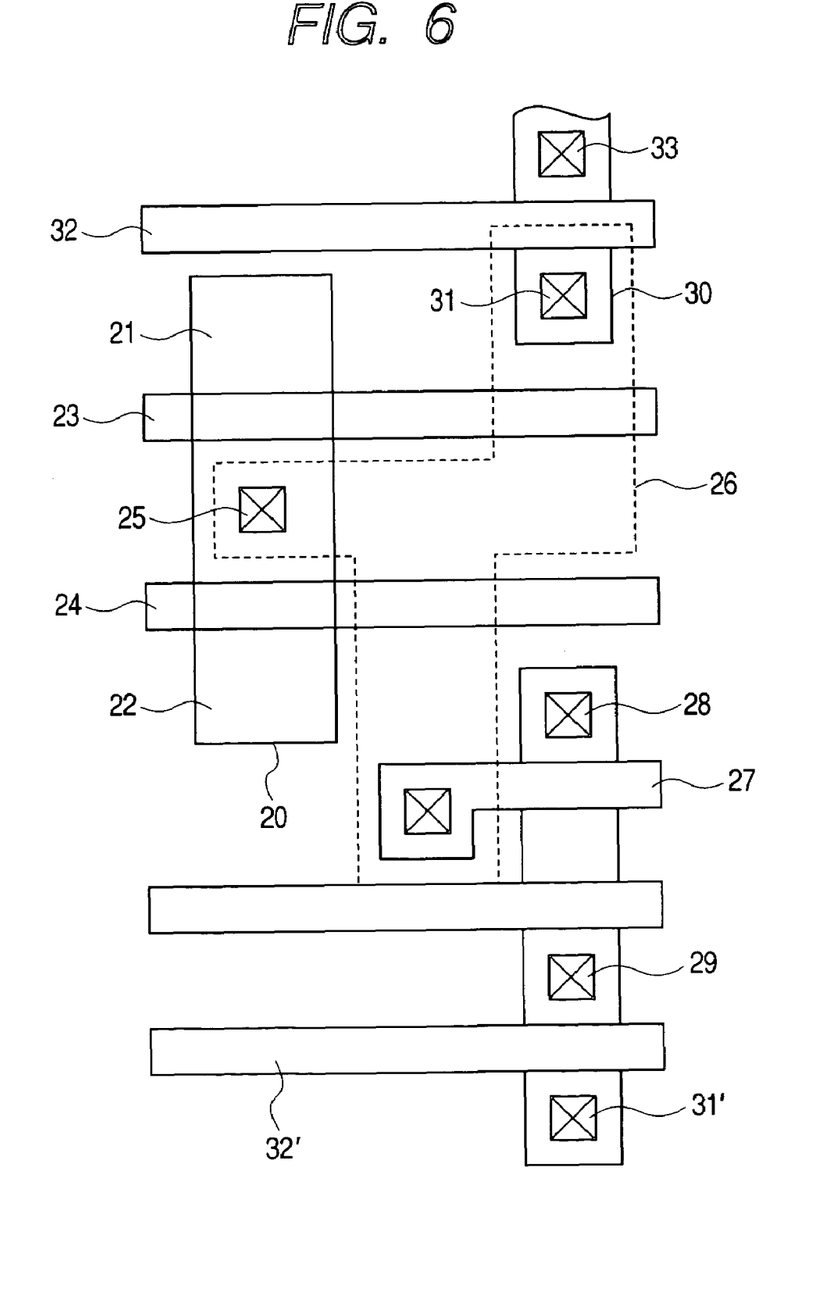
FIG. 6 is a plan view showing another conventional photoelectric conversion apparatus.

In this layout, the FD region 2106 is constituted of an L-shaped diffusion layer in order to minimize its capacitance value $C_{FD}$, in order to improve a charge-voltage conversion efficiency. Such a structure is disclosed in JP 2002-190586 A. Also, a depletion layer region 2208 is formed between the FD region 2106 constituted of an n$^+$ layer and a p-type substrate. FIG. 6 is a plan view of a unit cell of a solid state image pick-up device disclosed in JP H10-150182 A. In the structure shown in FIG. 6, unlike FIG. 5, gate wirings 23 and 24 of a readout transistor are not discrete for each pixel and are not arranged close to a drain 25 of the readout transistor.

The transfer MOS transistor 2103 of the transistors in FIG. 5 is an NMOS transistor, and has a gate electrode formed of a material including N-type polycrystalline silicon.

Figure 7:
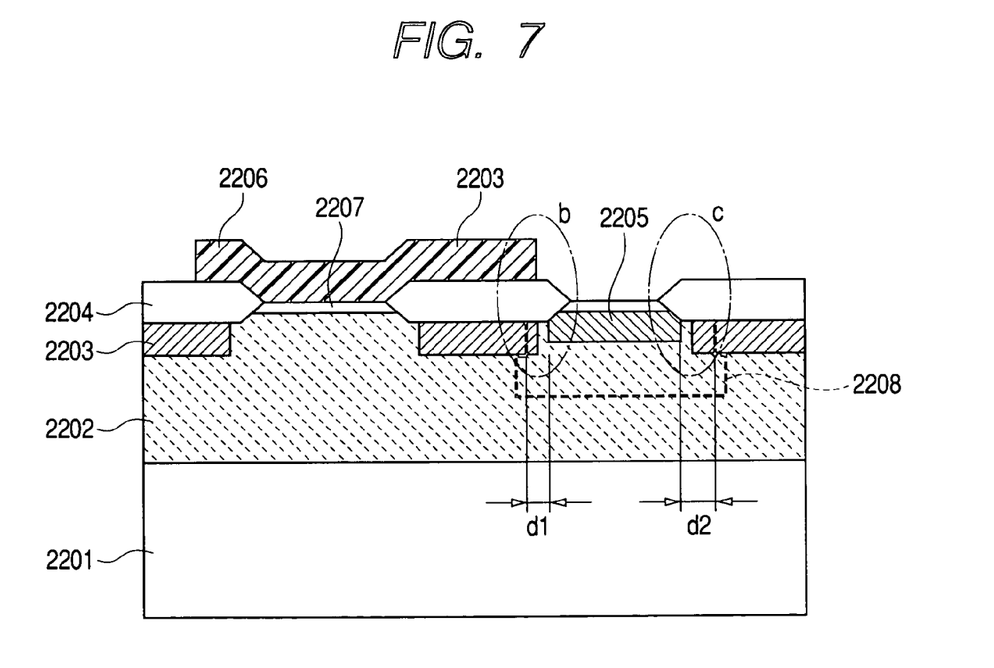
FIG. 7 is a sectional view taken along the line 7—7 of FIG. 5, which shows the conventional photoelectric conversion apparatus.

FIG. 7 is a sectional view taken along the line 7—7 of FIG. 5. In FIG. 7, reference numeral 2201 denotes an N-type silicon substrate; 2202, a P-type well; 2203, a P$^+$ type channel stop layer that is formed below a local-oxidation-of-silicon (LOCOS) oxide film 2204 in a self-aligned manner; 2205, an N$^+$ type diffusion layer that constitutes part of the FD region 2106; 2206, a gate electrode that is formed of high-concentration N-type polysilicon or silicide thereof; and 2207, a gate insulating film of the transfer MOS transistor 2103.

Next, circuit operation is explained with reference to a circuit diagram of FIG. 8 and a timing chart of FIG. 9.

Figure 8:
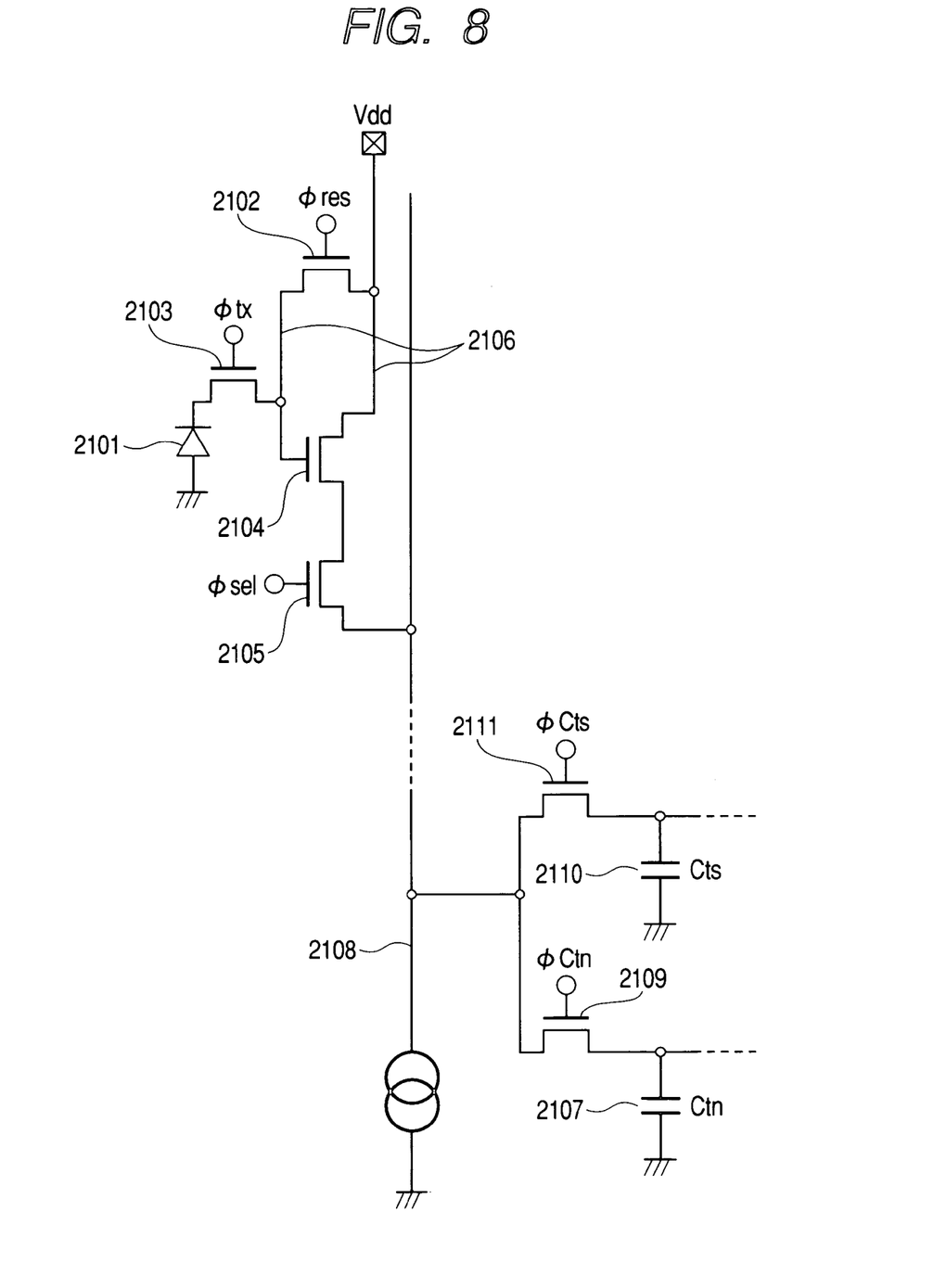
FIG. 8 is a circuit diagram showing an equivalent circuit of a photoelectric conversion apparatus.
Figure 9:
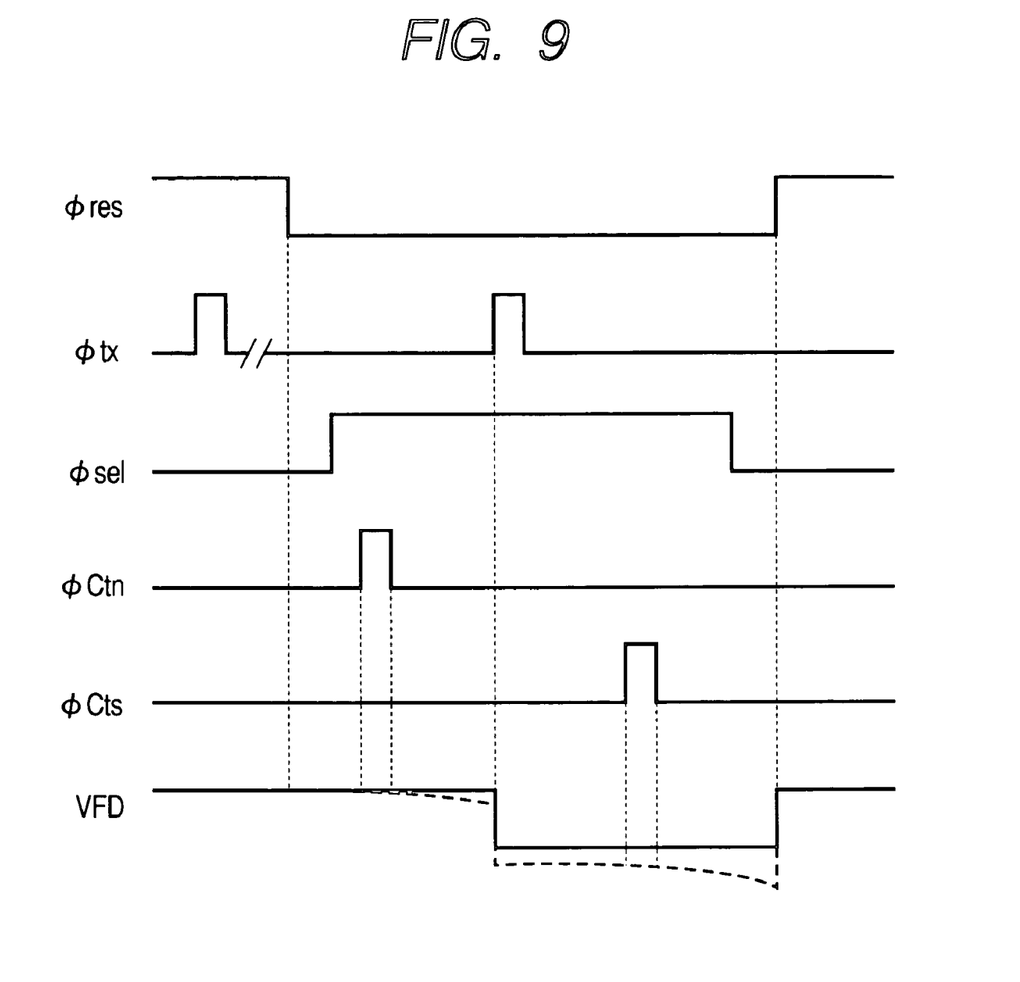
FIG. 9 is a timing chart showing operations of a photoelectric conversion apparatus.

In operation, the circuit is shifted from a state where the reset MOS transistor 2102 is turned ON to a state where the transfer MOS transistor 2103 is turned ON for resetting the photodiode 2101 of FIG. 8. After that, the transfer MOS transistor 2103 is turned OFF to reset the photodiode 2101. The photodiode in the reset state is then put into a charge accumulating state. After the lapse of a certain accumulation period, the reset MOS transistor 2102 is turned OFF and the row selection MOS transistor 2105 is turned ON. Thus, the source follower amplifier 2104 is activated. In this state, the voltage value of a vertical output line 2108 at the time of resetting the FD region 2106 is input (written) to a noise readout storage capacitor (Ctn) 2107 by turning ON a transfer transistor 2109. Then, the transfer transistor 2109 is turned OFF. Note that the time chart of FD in FIG. 9 schematically shows a voltage value change of the floating diffusion (FD) region 2106.

Next, the transfer MOS transistor 2103 is turned ON again, thereby to transfer signal charges in the photo diode 2101 to the FD region 2106. With this transfer, a potential change corresponding to the transferred signal charges appears in the time chart of FD In this state, a voltage value of the vertical output line 2108 at the time of transferring the signal charges to the FD region 2106 is input (written) to a signal readout storage capacitor (Cts) 2110 by turning ON a transfer transistor 2111. Then, the transfer transistor 2111 is turned OFF.

After that, a differential amplifier, etc., (not shown) are used for generating a voltage corresponding to a difference between the output charge of the storage capacitor Cts and that of the storage capacitor Ctn. This makes it possible to eliminate noise generated at the reset time of the reset MOS transistor 2102 of the pixel or variation in threshold voltage of the source follower amplifier 2104.

Here, in a layout portion as shown in a region of FIG. 7 where the N$^+$ type FD region 2205 and the P$^+$ type channel stop layer 2203 are formed close to each other and, in addition, the N$^+$ type poly-Si electrode overlies the P$^+$ type channel stop layer 2203, a leak current is more likely to flow between the FD region and the substrate. If the leak current is generated in this portion, as indicated by the dotted line in the time chart of FD of FIG. 9, the voltage of the FD region changes. As a result, the voltage values input (written) to the storage capacitors Ctn and Cts are different from the original (correct) ones, leading to a deterioration in image quality.

Regarding JP H10-150182 A, this publication has no description about an influence that may be exerted on how the depletion layer spreads by a concentration of a semiconductor layer close to the drain 25 or a concentration of a semiconductor region just below the gate wirings 23, 24 but excluding a channel formation region, or a work function of a material for each gate wiring. In a structure like that of FIG. 6, when a difference in work function between the gate electrode and the semiconductor region just below the gate wirings 23, 24 but excluding the channel formation region, takes a positive value or zero, as explained below, even if the channel stop is disposed close to the FD region, a leak current will not increase. Accordingly, the use of a structure of the present invention provides not noticeable but substantial advantage at least rather than the prior art.

SUMMARY OF THE INVENTION

It is therefore an object of the present invention to provide a photoelectric conversion apparatus with less leak current in a floating diffusion region.

In order to attain the above-mentioned object, a photoelectric conversion apparatus according to a first aspect of the present invention has a photodiode for converting light into a signal charge, a first semiconductor region having a first conductivity type, and a floating diffusion region formed from a second semiconductor region having a second conductivity type for converting the signal charge generated by the photodiode into a signal voltage, the second semiconductor region being formed in the first semiconductor region. The apparatus also comprises a depletion region formed in a border area between the first semiconductor region and the floating diffusion region, and an electrode is formed above the first semiconductor region and spaced from the first semiconductor region by an interposed insulating film, to increase the concentration of majority carriers in the first semiconductor region. Also provided are an isolation region disposed in the periphery of the photodiode, the electrode extending to overlap with the isolation region, and a third semiconductor region of the first conductivity type disposed beneath the isolation region. According to this aspect of the invention, the impurity concentration of the third semiconductor region is higher than that of the semiconductor region, and in addition, the electrode on the isolation region extends above at least part of the third semiconductor region, but does not extend above the depletion region.

A photoelectric conversion apparatus according to another aspect of the present invention comprises a plurality of pixels, each pixel of which comprises a first semiconductor region of a first conductivity type, a photodiode provided with a second semiconductor region of a second conductivity type disposed in the first semiconductor region for converting light into electron charge, and a transfer transistor for transfer the electron charge from the photodiode. Also provided are a third semiconductor region of the second conductivity type to which the electron charge from the photodiode is transferred through the transfer transistor, and an isolation region disposed in the periphery of the photodiode. According to this aspect of the invention, the transfer transistor has a gate electrode that extends so as to overlap with the isolation region. Also present is a fourth semiconductor region of the first conductivity type disposed beneath the isolation region, the impurity concentration of the fourth semiconductor region being higher than that of the first semiconductor region. The gate electrode of the transfer transistor (which is discrete for every pixel) extends above at least part of the fourth semiconductor region with the isolation region interposed therebetween, and the third semiconductor region is formed adjacent to the gate electrode of the transfer transistor, but does not extend to be adjacent to a laminated portion of the fourth semiconductor region, the isolation region and the gate electrode.

According to another aspect of the invention, there is provided a photoelectric conversion apparatus comprising a plurality of pixels, where each pixel comprises a first semiconductor region of a first conductivity type, a photodiode provided with a second semiconductor region of a second conductivity type disposed in the first semiconductor region for converting light into electron charge, and a transfer transistor for transfer the electron charge from the photodiode. A third semiconductor region of the second conductivity type receives the electron charge from the photodiode when the charge is transferred through the transfer transistor. In addition, an isolation region is disposed in the periphery of the photodiode, a gate electrode of the transfer transistor extending to overlap with the isolation region. Also, a fourth semiconductor region of the first conductivity type is disposed beneath the isolation region, and has an impurity concentration higher than that of the first semiconductor region. The gate electrode of the transfer transistor (which again is discrete for each pixel) extends above at least part of the fourth semiconductor region with the isolation region interposed therebetween, the pixel includes two laminated portions of the fourth semiconductor region, the isolation region and the gate electrode, and the width of the third semiconductor region in a side adjacent to the gate electrode is equal to or shorter than the distance between the two laminated portions.

The present invention can provide a photoelectric conversion apparatus capable of reducing a leak current in a floating diffusion region with a high S/N ratio, and a solid state image pick-up apparatus using the same.

DESCRIPTION OF THE PREFERRED EMBODIMENTS

Hereinafter, best modes for carrying out the present invention will be described in detail with reference to the accompanying drawings.

Embodiment 1

Figure 1:
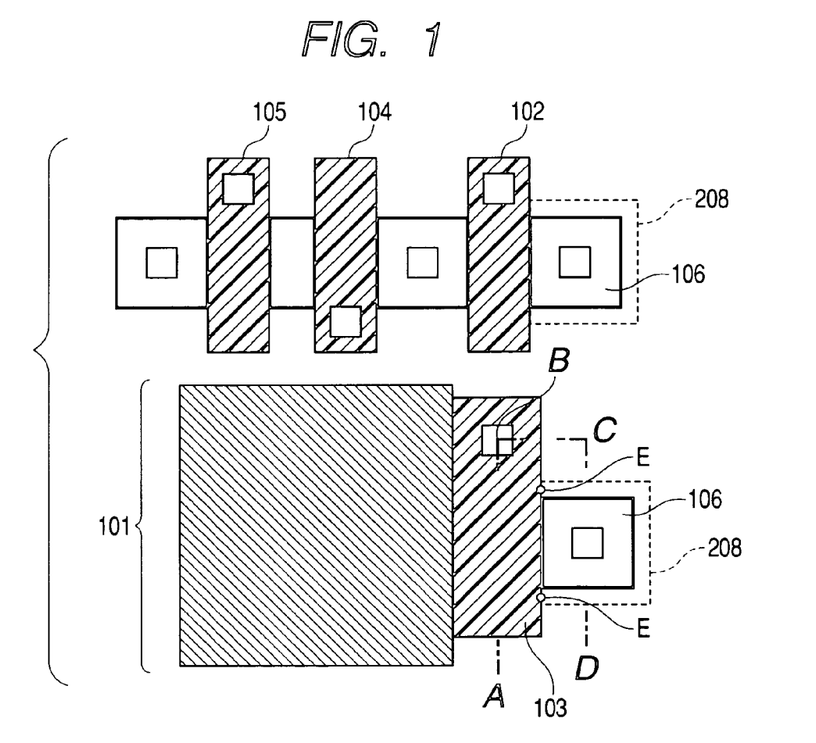
FIG. 1 is a plan view showing a photoelectric conversion apparatus according to an embodiment of the present invention.

FIG. 1 is a plan view showing a photoelectric conversion apparatus according to Embodiment 1 of the present invention. In FIG. 1, reference numeral 101 denotes a photo diode for photoelectrical conversion; 102, a reset transistor for resetting the photodiode 101 and a floating diffusion (FD) region 106; 103, a transfer MOS transistor for transferring (reading out) signal charges in the photodiode 101; 104, a source follower amplifier for converting the transferred (read-out) charges into a voltage, which has a gate electrode connected to the FD region 106; and 105, a row selection MOS transistor that connects an output of the source follower amplifier to a signal line.

Figure 2:
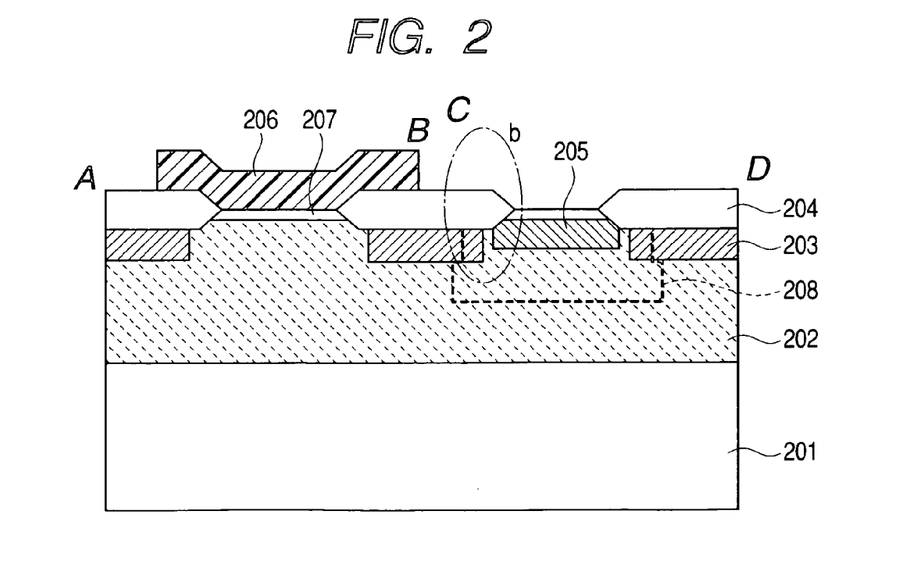
FIG. 2 is a sectional view taken along the line A-B-C-D of FIG. 1, which shows the photoelectric conversion apparatus according to the embodiment of the present invention.

FIG. 2 is a sectional view taken along the line A-B-C-D of FIG. 1. In FIG. 2, reference numeral 201 denotes an N-type silicon substrate; 202, a P-type well; 203, a P⁺ type channel stop layer formed below a local-oxidation-of-silicon (LOCOS) oxide film 204 in a self-aligned manner; 205, an N⁺ type diffusion layer that forms part of the FD region 106; and 206, a gate electrode. The gate electrode 206 is formed of high-concentration N-type polysilicon or silicide thereof. The use of such a material produces the effect that a gate portion of the transfer MOS transistor 103 increases a threshold voltage of the transistor with respect to the P-type well 202 according to a work function difference. Accordingly, the concentration in portions below the transfer gate is effectively increased, thereby achieving the effect of suppressing a dark current flowing in the photodiode from the portion below the gate electrode during the charge accumulation.

Reference numeral 207 denotes a gate insulating film of the transfer MOS transistor 103.

Reference numeral 208 denotes a depletion layer constituted of the N⁺ type diffusion layer 205 forming the FD region, the P-type well 202, and the P⁺ type channel stop layer.

Conventional ones involve a layout portion as shown in a region of FIG. 7 where an N⁺ type FD region 2205 and a P⁺ type channel stop layer 2203 are formed close to each other and in addition, an N⁺ type poly-Si electrode is formed above the P⁺ type channel stop layer 2203. In contrast, the present invention involves such a layout portion only at a point E of FIG. 1, which significantly reduces the risk of generating a leak current between the FD region and the substrate.

In FIG. 7, the mechanism of generating a leak current in the region is as follows. First, in a portion where the FD region 2205, a high-concentration N⁺ type layer, and the channel stop layer 2203, a P⁺ type layer, are formed close to each other, as for a voltage in the FD region 2205, during an operation of reading out signals, a PN junction is reverse-biased in terms of operation since a positive voltage is applied to the P-type well 2202. Also, the region includes a gate electrode 2206 made of N⁺ type polysilicon and formed across a LOCOS oxide film from a P-type channel stop layer 2203. The gate electrode 2206 and the P-type channel stop layer 2203 have a difference in work function therebetween. Therefore, even if the gate electrode 2206 and the P-type well 2202 have the same potential, the channel stop layer 2203 effectively increases a concentration of majority carriers by the work function difference, thereby changing its conductivity type to P⁺. As a result, the region in a depletion layer 2208 formed between the FD region 2205 and the P-type well 2202 has a depletion layer width smaller than that of the region not including the gate electrode 2206 (that is, d1<d2). A high electric field is applied between the N⁺ type diffusion layer 2205 and the P⁺ type channel stop layer 2203, and thus a leak current is easily generated.

That is, it can be concluded that when any material is laid out near a depletion layer, which effectively increases a concentration of majority carriers of a semiconductor region having an opposite conductivity type that forms a junction with the FD region to constitute the depletion layer, a leak current is apt to flow. For example, in the case of using, on the assumption that the FD region is formed of N-type silicon, N-type polysilicon or aluminum as a material having such a work function that causes majority carriers of a P-type region to effectively increase their concentration, and conversely in the case of using, on the assumption that the FD region is formed of P-type silicon, P-type polysilicon as a material having such a work function that causes majority carriers of an N-type region to effectively increase their concentration, a leak current is easily generated. Thus, in these cases, as shown in FIG. 1, it is more preferable to adopt a layout where the depletion layer of the FD region contacts the P⁺ type channel stop layer with the smallest area (at a point).

Also, this phenomenon essentially occurs when a concentration of the majority carriers in the semiconductor region having an opposite conductivity type that forms the junction with the FD region to constitute the depletion layer is effectively increased as mentioned above. Therefore, for example, when a gate electrode potential of the transfer MOS transistor 103 close to the FD region or a gate potential of the reset MOS transistor 102 is negative one, a leak current is easily generated irrespective of a gate electrode material. Also, regardless of the gate electrodes of the transfer MOS transistor 103 and reset MOS transistor 102 which define the FD region, in the case of forming (laying out) in the FD region above the depletion layer region, a material that effectively increases a concentration of majority carriers in the semiconductor region having an opposite conductivity type to that of the FD region or an electrode having a potential that effectively increases the concentration of the same, the depletion layer width is shortened, leading to generation of a high electric field and increase in leak current in the FD region. Therefore, although not shown, even if no channel stop layer is formed, it is necessary not to form the electrode directly above the depletion layer derived from the FD region in arranging the above electrode. More specifically, the electrode needs to be formed 0.1 to 0.5 mm, preferably 0.2 to 0.4 mm apart from the FD region.

Further, it is unclear from FIG. 6 in JP H10-150182 A how a voltage is applied to a drain 25 of a readout transistor corresponding to an FD region during its operation or how an electrode material and substrate material affect the depletion layer. That is, JP H10-150182 A does not necessarily show a case where a concentration of majority carrier in the channel stop is increased due to the work function difference so that an electric field in depletion layer (between the diffusion layer (FD region) and the channel stop) is strengthened and thus a leak current increases when a reverse bias is applied between the well region and diffusion region. In the case where the material or voltage condition has an effect of weakening an electric field of the depletion layer, the use of the structure shown in FIG. 2, according to the present invention, provides not noticeable but substantial advantage at least rather than the prior art.

Embodiment 2

Figure 3:
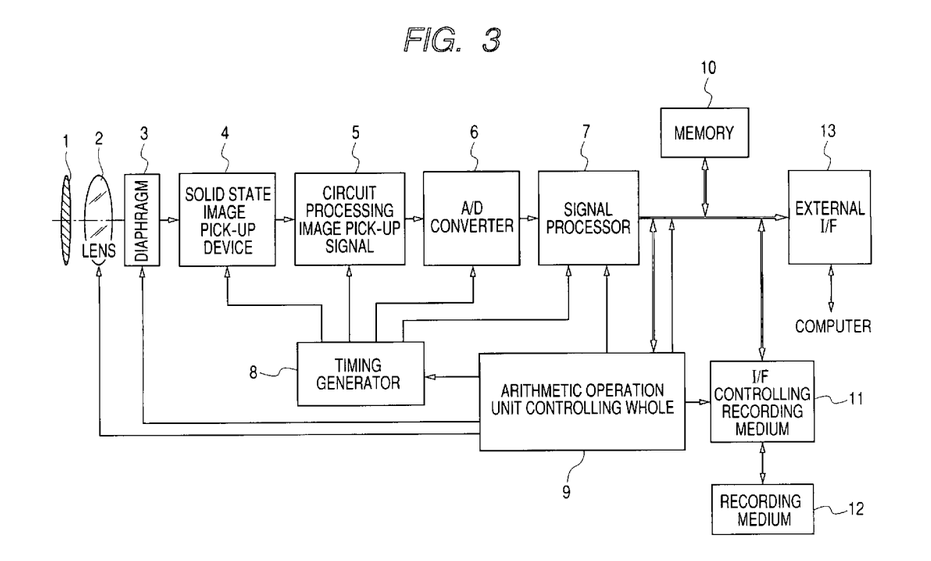
FIG. 3 is a block diagram showing a structure of an image pick-up apparatus according to an embodiment of the present invention.

FIG. 3 shows a system configuration of an image pick-up apparatus using the photoelectric conversion apparatus of the above embodiment, as an image pick-up apparatus according to the present invention. In FIG. 3, an image pick-up apparatus includes: a barrier or shutter 1 serving as both a protector of a lens and a main switch thereof; a lens 2 for focusing an optical image of an object on a solid state image pick-up device 4; a diaphragm 3 for adjusting how much of the light that has passed through the lens 2 is allowed to reach the solid state image pick-up device 4 (corresponding to the photoelectric conversion apparatus as described in the above embodiment) for taking in the formed object image through the lens 2 as an image signal; a circuit 5 processing image pick-up signal for effecting various types of correction or clamping on the image signal output from the solid state image pick-up device 4; an A/D converter 6 for effecting analog-digital conversion on the image signal output from the solid state image pick-up device 4; a signal processor 7 for effecting various types of correction or data compression on image data output from the A/D converter 6; and a timing generator 8 for outputting various timing signals to the solid state image pick-up device 4, the circuit 5 processing image pick-up signal, the A/D converter 6, and the signal processor 7. Note that the solid stage image pick-up device 4, the circuit processing image pick-up device 5, the A/D converter 6, the signal processor 7, and the timing generator 8 may all be mounted on the same chip. A solid state image pick-up system is configured by an arithmetic operation unit controlling unit 9 for performing various arithmetic operations and controlling the whole still video camera; a memory 10 for temporarily storing image data; an interface (I/F) controlling a recording medium 11 for recording or reading out data on/from a recording medium; a removably insertable recording medium 12 for recording or reading out image data, such as a semiconductor memory; and an external interface (I/F) 13 for communicating with an external computer, etc.

Next, explanation is given of an operation of the system shown in FIG. 3. Upon opening the shutter 1, a main power source is turned ON, and then the control system is powered on, as is the image pick-up system circuit including the A/D converter 6. Subsequently, the arithmetic operation unit controlling unit 9 opens the diaphragm 3 for controlling an exposure amount and signals output from the solid state image pick-up device 4 directly pass through the circuit 5 processing image pick-up signal to be output to the A/D converter 6. The A/D converter 6 effects A/D conversion on the signals to be output to the signal processor 7. The signal processor 7 calculates the exposure amount based on the input data with the arithmetic operation unit controlling unit 9.

Lightness is judged based on results of the exposure metering and the arithmetic operation unit controlling unit 9 controls the diaphragm according to the judgment result. Next, a high-frequency component is extracted based on signals output from the solid state image pick-up device 4 and the arithmetic operation unit controlling unit 9 calculates a distance to an object. After that, the lens 2 is driven, and a judgment is made a to whether or not focusing is obtained. If it is judged that the system is not focused, the lens 2 is driven again to measure the distance to the object.

Then, after focusing is confirmed, the main exposure starts. After the completion of the exposure, the image signals output from the solid state image pick-up device 4 undergo correction, etc., with the circuit 5 processing image pick-up signal and A/D conversion with the A/D converter 6, and then pass through the signal processor 7 to be stored in the memory 10 with the arithmetic operation unit controlling whole 9. After that, data stored in the memory 10 is recorded on the removably insertable recording medium 12 such as a semiconductor memory, through the I/F controlling recording medium 11 under the control of the arithmetic operation unit controlling unit 9. Also, the data may be directly input to a computer, etc., through the external I/F 13 for image processing.

The present invention can be used for taking an image.

This application claims priority from Japanese Patent Application No. 2003-380090, filed on Nov. 10, 2003, which is hereby incorporated by reference herein.

What is claimed is:

1. A photoelectric conversion apparatus, comprising:
a photodiode for converting light into a signal charge;
a first semiconductor region having a first conductivity type;
a floating diffusion region formed from a second semiconductor region having a second conductivity type for converting the signal charge generated by the photodiode into a signal voltage, the second semiconductor region being formed in the first semiconductor region;
a depletion region formed in a border area between said first semiconductor region and said floating diffusion region;
an electrode formed above the first semiconductor region and spaced from the first semiconductor region by an interposed insulating film;
an isolation region disposed in the periphery of the photodiode, said electrode extending to overlap with the isolation region; and
a third semiconductor region of the first conductivity type disposed beneath the isolation region, the impurity concentration of the third semiconductor region being higher than that of the semiconductor region,
wherein when a reverse bias is applied between said first semiconductor region and the floating diffusion region, a concentration of majority carriers in said third semiconductor region effectively increases, and said electrode on said isolation region extends above at least part of the third semiconductor region, but does not extend above said depletion region.

2. A photoelectric conversion apparatus group, comprising a plurality of the photoelectric conversion apparatuses according to claim 1, which are arranged in one of one-dimensional array or two-dimensional array.

3. A photoelectric conversion apparatus according to claim 1, wherein the electrode is formed of a material including N-type polysilicon and a conductivity type of the third semiconductor region is P-type.

4. A photoelectric conversion apparatus according to claim 1, wherein the electrode has a potential that induces an increase in concentration of majority carriers in the third semiconductor region when the photodiode is put in an accumulation state.

5. A photoelectric conversion apparatus according to claim 4, wherein the electrode has a negative potential and a conductivity type of the third semiconductor region is P-type.

6. An image pick-up system, comprising:
the photoelectric conversion apparatus according to claim 1;
a lens in front of the photoelectric conversion apparatus and for focusing an image on the photoelectric conversion apparatus to generate the electron charge; and
means for storing an image signal derived from the signal voltage in the photoelectric conversion apparatus.

* * * * *